United States Patent [19]

Arroubi et al.

[11] Patent Number: 5,450,059
[45] Date of Patent: Sep. 12, 1995

[54] DETECTION SYSTEM AND METHOD FOR THE VERIFICATION OF THE FUNCTIONING OF THE DETECTION SYSTEM BY INSTANTANEOUS COMPARISON OF THE STATE OF A NODE ON A RECEPTOR AND A NODE ON A DETECTOR

[75] Inventors: Mustapha Arroubi, Lully; Michel G. E. Lalande, Missy, both of France

[73] Assignee: Moulinex (Societe Anonyme), Bagnolet, France

[21] Appl. No.: 79,522

[22] Filed: Jun. 21, 1993

[30] Foreign Application Priority Data

Jun. 22, 1992 [FR] France .................................. 92 07595

[51] Int. Cl.⁶ .......................................... G08B 29/00
[52] U.S. Cl. ........................................ 340/515; 340/514
[58] Field of Search ............... 340/514, 515, 518, 505, 340/507, 522; 364/141, 186

[56] References Cited

U.S. PATENT DOCUMENTS

| | | | |
|---|---|---|---|
| 3,801,978 | 4/1974 | Gershberg et al. | 340/522 |
| 4,603,318 | 7/1986 | Philp | 340/505 |
| 4,652,819 | 3/1987 | Kammerer | 340/514 |
| 4,870,394 | 9/1989 | Corl et al. | 340/514 |
| 4,962,368 | 10/1990 | Dobrzanski et al. | 340/514 |
| 4,990,895 | 2/1991 | Juds | 340/635 |
| 5,151,682 | 9/1992 | Marinitsch | 340/515 |

FOREIGN PATENT DOCUMENTS

| | | | |
|---|---|---|---|
| 0316973 | 5/1989 | European Pat. Off. | G01R 31/28 |
| 0327082 | 8/1989 | European Pat. Off. | H03K 17/97 |
| 0440051 | 8/1991 | European Pat. Off. | A47J 42/56 |
| 2485774 | 12/1981 | France | G08B 29/00 |
| 3700617 | 7/1988 | Germany | G01V 9/04 |
| 2110386 | 6/1983 | United Kingdom | G01R 31/00 |
| 2127603 | 4/1984 | United Kingdom | G08B 29/00 |

*Primary Examiner*—Victor R. Kostak
*Assistant Examiner*—John W. Miller
*Attorney, Agent, or Firm*—Young & Thompson

[57] ABSTRACT

Detection system with receptor controlled by an emitter and having a microcontroller and a device to verify the proper functioning of the receptor which includes an additional control circuit connected to the receptor and to a terminal of the microcontroller. The microcontroller includes a generator-programmer which controls at time intervals the emission of a signal to activate the additional control circuit which forces the receptor to assume its non-conducting state, and which analyzes the corresponding instantaneous state of a node of the detector in such a manner as to prevent the control center from directing the control circuit if its instantaneous state is different from the inactive state.

16 Claims, 2 Drawing Sheets

DETECTION SYSTEM AND METHOD FOR THE VERIFICATION OF THE FUNCTIONING OF THE DETECTION SYSTEM BY INSTANTANEOUS COMPARISON OF THE STATE OF A NODE ON A RECEPTOR AND A NODE ON A DETECTOR

BACKGROUND OF THE INVENTION

1. Field of the Invention

The present invention relates to detection systems with receptors controlled by an emitter and comprising an electronic control center some of whose nodes are adapted to direct a control circuit and whose at least one node $P_i$ is connected to the receptor which may take, thanks to a supply source $V_{cc}$, either a conducting state when it is correctly influenced by the emitter and for which the node $P_i$ is brought to an active state permitting the control center to direct the control circuit, or in a non-conducting state when it is incorrectly influenced by the emitter and for which the node $P_i$ is brought to an inactive state preventing the control center from directing said control circuit.

2. Description of the Related Art

Such detection systems, in which the receptor may be a HALL effect cell, or an infrared receptor or an oscillating coil, are generally utilized to control security devices, or to direct control circuits of electric devices according to the presence or absence of the emitter; for example, a HALL effect receptor has already been utilized in culinary robots with multiple functions. In either of these uses, the functioning of the detection system relies entirely on the dependability of the receptor.

Unfortunately, it happens that in certain cases, these components present anomalies at the level of the HALL effect cell, or of the infrared cell, and/or the output transistor and assume their conducting state permanently, without regard to the influence of the emitter. The detection system therefore becomes ineffectual in all of its applications and particularly in those of security and may even, when utilized in an electric device such as a culinary robot, occasion injury to the user who is confused as to the functioning of the device.

The goal of the invention is therefore to eliminate these disadvantages and to render the functioning of these detection systems dependable.

According to the invention, the detection system comprises a device to verify the proper functioning of the receptor which comprises an additional control circuit connected, on the one hand, to the receptor, and, on the other hand, to another node $P_c$ of the control center, as well as in the control center a generator-programmer which controls, at intervals, the emission on said node $P_c$ of a signal activating the additional control circuit forcing the receptor to assume its non-conducting state, and which analyzes the instantaneous state corresponding to the node $P_i$ as a function of the state of the node $P_c$ in such a manner as to prevent the control center from directing the control circuit if this instantaneous state is different from the inactive state.

Thanks to this verification device, one is certain that whatever the state of functioning of the receptor, damaged or not, the control center will not be able to direct the control circuit, even in the presence of the emitter or of the object to be detected, as long as the comparison made at time intervals determines the incompatibility between the activation signal on the node $P_c$ and the state of the node $P_i$ subordinated to the receptor which must assume, under this activation, its non-conducting state.

BRIEF DESCRIPTION OF THE DRAWINGS

The characteristics and advantages of this invention will become apparent from the description which follows, given by way of example, with reference to the annexed drawings in which.

DESCRIPTION OF THE PREFERRED EMBODIMENT

Figure 1:
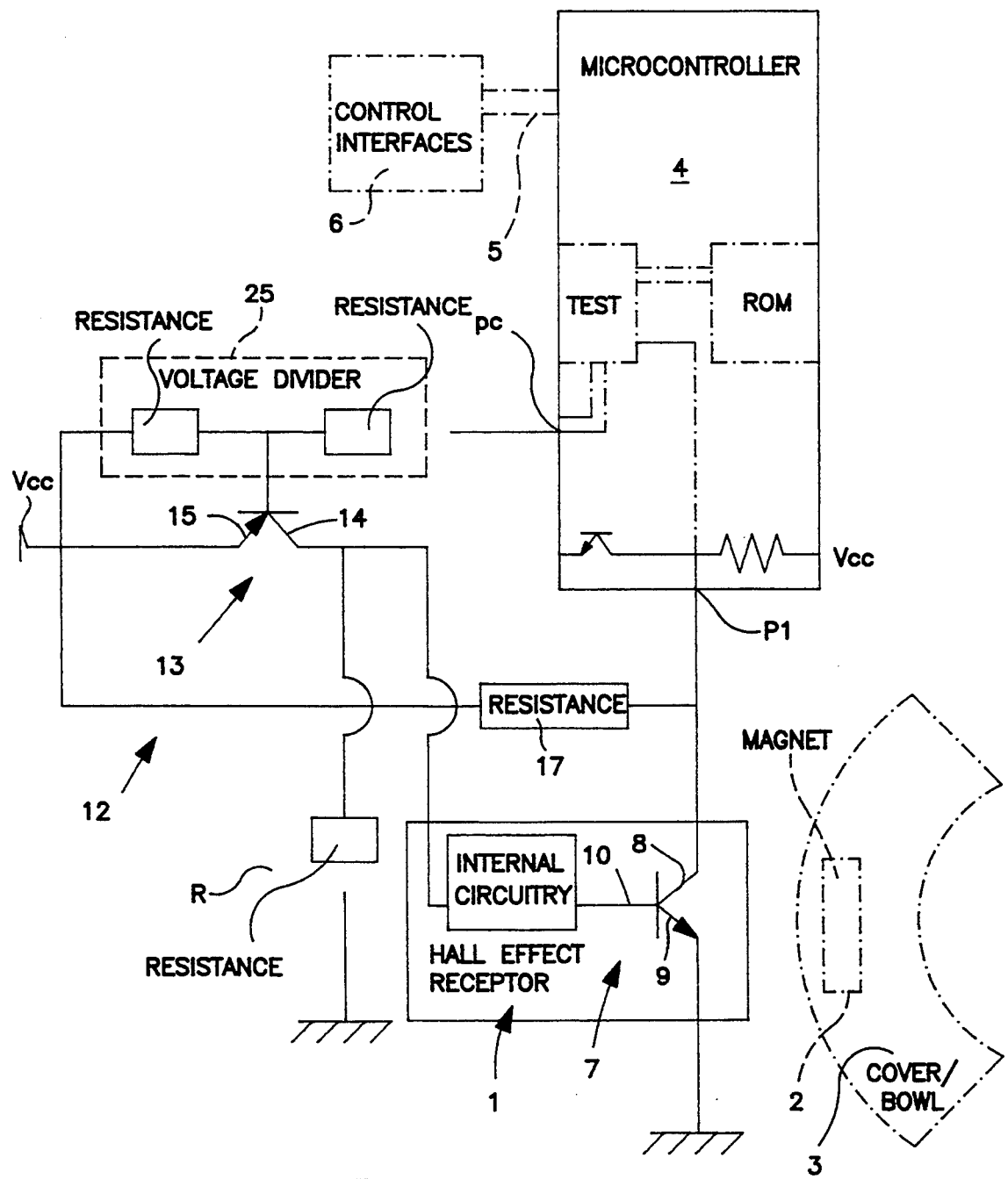
FIG. 1 is a diagram of the detection system according to the invention and according to a first embodiment.
Figure 2:
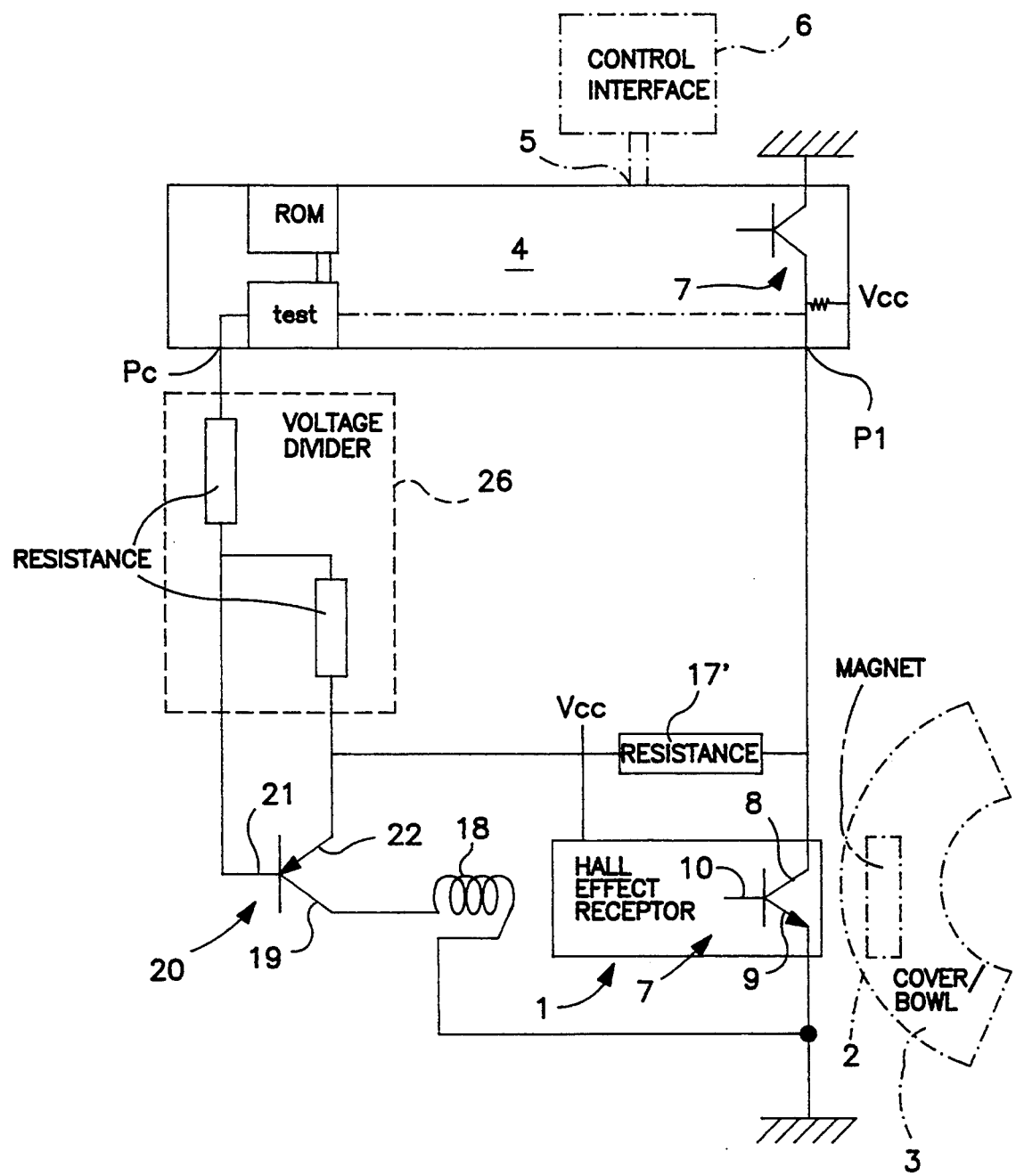
FIG. 2 is a diagram of a second embodiment of the detection system according to the invention.

As represented in FIGS. 1 and 2, the detection system is utilized, according to a preferred embodiment, with a HALL effect receptor 1 controlled by an emitter with a magnetic field such as, for example, that of a magnet 2, and adapted to direct a control circuit of an electric device of the culinary robot type, for example. Such a culinary robot has been described in French patent application No. 90 00 930 filed Jan. 26, 1990 by the applicant. In such a robot, the HALL effect receptor 1 is mounted in the housing, whereas the magnet 2 is mounted in the bowl and/or in the cover 3 of said bowl.

The control circuit of the device comprises a control center such that, in known fashion, a microcontroller 4 some of whose nodes 5 are connected to a control interface 6 of the motor of the robot and one of whose input-output nodes PI is connected to the receptor 1. As schematically represented in dashed lines, the microcontroller 4 of the type, for example, 8051 of the INTEL company, comprises a read-only memory M and in its internal plug-in circuit of input-output nodes called ports an electrical equivalent comprising an NPN type transistor connected on the one hand to ground and, on the other hand, to a source $V_{cc}$ by a resistance as well as to said node $P_i$.

This HALL effect receptor 1 comprises an output transistor 7 of the NPN type whose collector 8 is connected to the terminal $P_i$ of the microcontroller and whose emitter 9 is connected to the ground of the circuit, whereas the base 10 is powered by an internal electronic circuit of the receptor, by a direct current source $V_{cc}$. The output transistor 7 may assume either a conducting state called saturated when the receptor is correctly influenced by the magnetic field, meaning in the case of the presence of the accessory and/or the correct closing of the bowl by the cover, and for which the node $P_i$ is brought to an active, or low state permitting the microcontroller 4 to direct the control circuit, or in a non-conducting state during which the receptor is not correctly influenced by the magnetic field, meaning in the absence of the bowl and/or of the cover, and for which the node $P_i$ is brought to an inactive, or high state preventing the microcontroller 4 from directing said control circuit. The direct current source used has a so-called high voltage of 5 volts and a so-called low voltage corresponding to the ground of the circuit.

According to the invention, the detection system comprises a device to verify the proper functioning of the HALL effect receptor 1 which comprises an additional control circuit connected, on the one hand, to a receptor 1, and, on the other hand, to another input-output node $P_c$ of the microcontroller 4, as well as to a generator-programmer associated with a test program installed in the read-only memory M of said microcontroller, said test program controlling the emission, at time intervals on said node $P_c$, of an activation signal of the additional control circuit 12 forcing the receptor 1 to assume its non-conducting state, and analyzing the instantaneous state corresponding to the node $P_i$ in such a manner as to prevent the microcontroller from directing the control circuit if its instantaneous state is different from its inactive state. The test program progresses at regular time intervals of, for example, 20 milliseconds, or according to random intervals.

Thanks to this verification device, the additional control circuit is activated by the test program and verifies at periodic time intervals or random time intervals the proper functioning of the receptor, meaning the internal elements such as the HALL cell and/or the output transistor in such a manner as to avoid all erroneous controls of the control circuit of the electrical device by the microcontroller.

According to a preferred embodiment of the invention illustrated in FIG. 1, the additional control circuit 12 comprises an electronic switch 13 of the PNP transistor type whose output 14 or so-called collector is connected to the ground of the circuit via a resistance R as well as to the receptor 1, thus, via a circuit internal to the receptor to the base 10 of the output transistor 7, and whose input 15 or so-called emitter is connected to the direct supply source $V_{cc}$, whereas the base 16 is connected by a voltage divider 25 to the node $P_c$ of the microcontroller 4. Moreover, the node $P_i$ of the microcontroller is connected to the source $V_{cc}$ via a current limiting resistance 17.

The operation will now be described according to two phases, the first phase corresponding to the normal operation with the receptor 1 undamaged, and a second phase corresponding to an abnormal operation with the receptor 1 damaged.

According to the first phase of operation, the cover 3 and/or the bowl is assumed to be correctly in place and the magnet 2 is assumed to be directly influencing the HALL effect receptor 1. The output transistor 7 is saturated and the node $P_i$ is in its active or low state, being at ground potential. The microcontroller 4 is thus adapted to direct the functioning of the device by the interface 6, and therefore in the case of the culinary robot, to turn on the motor and to control its speed.

If the bowl and/or the cover 3 is removed, the receptor 1 no longer being influenced by the magnet 2, the output transistor 7 assumes its non-conducting state and the node $P_i$ is supplied via the limiting resistance 17 by the source $V_{cc}$ and finds itself in its inactive or high state. In this manner the microcontroller is not able to direct the control circuit of the device and thus the functioning of the motor.

During the functioning of the device, the test program sends, for example every 20 milliseconds, an activation signal which puts the node $P_c$ in a high state corresponding to a potential of 5 volts. The transistor 13 transitions to its non-conducting state because its base 16 is powered, which brings the output transistor 7 to its non-conducting state and thus the node $P_i$ to its high state. The test program analyzes the instantaneous state of the node $P_i$, notes the inactive, or high state of the node $P_i$ and concludes by comparison with the state of the node $P_c$ that the HALL effect receptor 1 is not damaged.

According to the second phase of functioning, the cover and/or bowl is assumed to be not correctly in place and the magnet 2 not directly influencing the HALL effect receptor 1, but the HALL cell or the output transistor 7 is damaged, which corresponds to a short circuit. Under these conditions, the output transistor 7 is in its saturated state and the node $P_i$ finds itself in its low state and permits the direction of the control circuit of the device in a normal fashion. Meanwhile, as the test program progresses every 20 milliseconds and sends on the node $P_c$ an activation signal making it transition to its high state, the transistor 13 is brought to a non-conducting state which brings the output transistor 7 also to its non-conducting state because it no longer receives current at its base 10 and therefore the node $P_i$ should be brought to its high state. But due to the damage to the HALL cell and/or the output transistor corresponding to a short circuit, the node $P_i$ is directly connected to the ground of the circuit and is in its low state. Consequently, the test program notes the inequality between the states of the nodes $P_c$ and $P_i$ and concludes that the receptor 1 is damaged while therefore preventing the microcontroller from directing the device.

According to an alternative embodiment of the invention illustrated in FIG. 2, the additional control circuit comprises, in addition to the test program, a coil shown at 18 which is arranged behind the HALL effect receptor 1 and which is adapted to produce a magnetic field at least equal to that of the magnet 2 and opposed to that of the magnet. Said coil 18 is connected, on the one hand, to the ground of the circuit, and, on the other hand, to the collector 19 of an electronic switch 20 of the PNP transistor type whose base 21 is connected by a voltage divider 26 with the node $P_c$ of the microcontroller 4. As to the node $P_i$ of the microcontroller 4, it is connected to the collector 8 of the output transistor 7 as well as by a resistor 17' to a direct current source $V_{cc}$ connected as well to the receptor 1 and to the emitter 22 of the transistor 20. In this manner, the node $P_i$ is brought to its high state almost corresponding to the voltage $V_{cc}$ whereas the transistor 7 is in its non-conducting state.

The functioning of this alternative embodiment will now be described only in the case wherein the HALL effect receptor 1 is damaged. In this embodiment, the test program progressing for example each 20 milliseconds sends on the node $P_c$ an activation signal making it transition to its low state. The transistor 20 is saturated and the coil 18 is powered creating in this manner a magnetic field at least equal and opposite to that of the magnet 2 in such a manner as to cancel the field of the magnet 2. The receptor 1 should, in this forced condition, be non-conducting and bring the node $P_i$ to its inactive or high state. But on the contrary, the node $P_i$, by the short circuit of the output transistor 7, is in its active or low state directly connected to ground. The test program, by instantaneous comparison with the state of the node $P_c$, concludes that the receptor 1 is damaged.

In this manner, the process for implementation of the device to verify the proper functioning of the receptor consists in sending on the node $P_c$ of the microcontroller 4 with the aid of a test program an activation signal corresponding to a certain potential; in sending that signal to an additional control circuit in such a manner as to permit it to direct the receptor 1; in forcing said receptor to assume a non-conducting state; in analyzing the instantaneous active or inactive state of the node $P_i$, meaning its potential; in comparing it to the potential of the node $P_c$; and in concluding that the receptor 1 is functioning properly if the state of the node $P_i$ is compatible with the activation state of the node $P_c$, and in the contrary case, that the receptor has been damaged.

As is understood, this device to verify the proper functioning of a receptor is equally applicable to all security systems comprising, for example, an infrared receptor or an oscillating coil, whose purpose is to verify the presence or absence of an activation emitter of the corresponding receptor.

What is claimed is:

1. In a detection system having a receptor (1) controlled by an emitter and comprising a microcontroller acting as an electronic center (4), a device to verify a proper functioning of the receptor, an additional control circuit (12) connected to the receptor (1) and to a node $P_c$ of the control center (4), another node Pi of the control center (4) being connected to the receptor (1) which selectively assumes, thanks to a direct supply voltage $V_{cc}$, one of a conduction state when it is correctly influenced by the emitter in which the node $P_i$ is brought to an active state permitting the control center to direct the control circuit, and a non-conducting state when it is incorrectly influenced by the emitter in which the node $P_i$ is brought to an inactive state preventing the control center (4) from directing said control circuit; the improvement wherein the control center (4) comprises a generator programmer which controls at time intervals an emission on said node $P_c$ of an activation signal of the additional control circuit (12) forcing the receptor (1) to assume its non-conducting state and said microcontroller has an internal read-only memory M which comprises a test program for directing the generator programmer and for making an instantaneous comparison between the state of node $P_i$ and the state of the node $P_c$, said node $P_i$ being put in its non-conducting state to prevent the control center (4) from directing the control circuit (12).

2. Detection system according to claim 1, wherein the additional control circuit (12) comprises an electronic switch (13) having an input and an output, said switch being controlled by the node $P_c$ and having an output (14) connected to the receptor (1) and an input (15) connected to $V_{cc}$ as well as to the node $P_i$ by a limiting resistance (17—17') in such a manner that the node $P_i$ is brought to its inactive state almost corresponding to the voltage of the source $V_{cc}$ when the receptor is in its non-conducting state.

3. Detection system according to claim 2, wherein the receptor (1) comprises an output NPN transistor (7) having a base, a collector and an emitter, said emitter (9) being connected to a ground potential of the system and said collector (8) being connected to the node $P_i$, whereas said base (10) is connected to the source $V_{cc}$ via the electronic switch (13) which is a PNP transistor (15) whose emitter and whose collector (14) are connected to the source $V_{cc}$ and said base (10) respectively, and whose base (16) is connected with the node $P_c$ of the microcontroller (4).

4. Detection system with receptor according to claim 1, wherein the receptor (1) is a HALL-effect receptor and the emitter is a magnetic field.

5. Detection system according to claim 4, wherein the additional control circuit (12) comprises a coil (18) which is arranged behind the HALL-effect receptor (1) and which is adapted to produce a magnetic field opposed to and at least equal to that magnetic field which correctly influences the receptor, said coil being connected to a ground potential of the system, and to an output (19) of an electronic switch (20) which is controlled by the node $P_c$ of the control center and whose input (22) is connected to the source $V_{cc}$ and wherein the node $P_i$ is also connected to the source $V_{cc}$ and is brought to its inactive state almost corresponding to said voltage $V_{cc}$ when the output transistor (7) is in its non-conducting state.

6. Detection system according to claim 5, wherein the output transistor (7) of the receptor is an NPN type transistor whose emitter (9) is connected to the ground of the circuit, and the electronic switch (20) is a PNP type transistor whose base (21) is connected to the terminal $P_c$ of the microcontroller and whose collector is an output (19).

7. Detection system according to claim 4, wherein said magnetic field which influences the receptor is created by a magnet (2).

8. Detection system according to claim 1, wherein the activation signal is emitted on the node $P_c$ by the generator-programmer according to a cycle of 20 milliseconds.

9. In a detection system having a receptor (1) controlled by an emitter and comprising a microcontroller acting as an electronic control center (4) some of whose nodes are adapted to direct a control circuit, one of whose nodes $P_i$ is connected to the receptor which selectively assumes, thanks to a direct supply voltage source $V_{cc}$ one of a conducting state when it is correctly influenced by the emitter in which the node $P_i$ is brought to an active state permitting the control center to direct the control circuit, and a non-conducting state when it is incorrectly influenced by the emitter in which the node $P_i$ is brought to an inactive state preventing the control center (4) from directing said control circuit; the improvement wherein said detection system comprises a device to verify a proper functioning of the receptor, which device comprises an additional control circuit (12) connected to the receptor (1) and to another node $P_c$ of the control center (4), and in the control center, a generator programmer which controls at time intervals an emission on said node $P_c$ of an activation signal of the additional control circuit (12) forcing the receptor (1) to assume its non-conducting state, and which analyzes a corresponding instantaneous state of the node $P_i$ as a function of a state of the node $P_c$ in such a manner as to prevent the control center from directing the control circuit if its instantaneous state is different from the inactive state, said additional control circuit (12) comprising an electronic switch (13) having an input and an output, said switch being controlled by the node $P_c$ and having an output (14) connected to the receptor (1) and an input (15) connected to $V_{cc}$ as well as to the node $P_i$ by limiting resistance (17—17') in such a manner that the node $P_i$ is brought to its inactive state almost corresponding to the voltage of the source $V_{cc}$ when the receptor is in its non-conducting state.

10. Detection system with receptor according to claim 9, wherein the receptor (1) is a HALL-effect receptor and the emitter is a magnetic field.

11. Detection system according to claim 10, wherein the additional control circuit (12) comprises a coil (18) which is arranged behind the HALL-effect receptor (1) and which is adapted to produce a magnetic field opposed to and at least equal to that magnetic field which correctly influences the receptor, said coil being connected to a ground potential of the system, and to an output (19) of an electronic switch (20) which is controlled by the node $P_c$ of the control center and whose input (22) is connected to the source $V_{cc}$ and wherein the node $P_i$ is also connected to the source $V_{cc}$ and is brought to its inactive state almost corresponding to said voltage $V_{cc}$ when the output transistor (7) is in its non-conducting state.

12. Detection system according to claim 11, wherein the output transistor (7) of the receptor is an NPN type transistor whose emitter (9) is connected to the ground of the circuit, and the electronic switch (20) is a PNP type transistor whose base (21) is connected to the terminal $P_c$ of the microcontroller and whose collector is an output (19).

13. Detection system according to claim 10, wherein said magnetic field which influences the receptor is created by a magnet (2).

14. Detection system according to claim 9, wherein the receptor (1) comprises an output NPN transistor (7) having a base, a collector and an emitter, said emitter (9) being connected to a ground potential of the system and said collector (8) being connected to the node $P_i$, whereas said base (10) is connected to the source $V_{cc}$ via the electronic switch (13) which is a PNP transistor (15) whose emitter and whose collector (14) are connected to the source $V_{cc}$ and said base (10) respectively, and whose base (16) is connected with the node $P_c$ of the microcontroller (4).

15. Detection system according to claim 9, wherein the activation signal is emitted on the node $P_c$ by the generator-programmer according to a cycle of 20 milliseconds.

16. Process to determine a proper functioning of a receptor controlled by an emitter in a detection system, said system comprising a microcontroller acting as an electronic control center (4), some of whose nodes are adapted to direct a control circuit and at least one node $P_i$ being connected to the receptor, which receptor may assume, thanks to a D.C. voltage source $V_{cc}$, either a conducting state when it is correctly influenced by the emitter in which node $P_i$ is brought to an active state permitting the control center to direct the control circuit, or a non-conducting state when incorrectly influenced by the emitter in which node $P_i$ is brought to an inactive state preventing the control center (4) from directing said control circuit, said system further comprising an additional control circuit (12) connected to said receptor and to a node $P_c$ of the control center, said control center having a generator-programmer which controls at time intervals an emission on said node $P_c$ of an activation signal of said additional control circuit, comprising the steps of:

sending on the node $P_c$ of the microcontroller (4), by a test program contained in said microcontroller (4), an activation signal corresponding to a certain voltage potential, sending said signal to an additional control circuit in such a manner as to permit it to control the receptor (1) to make it assume its non-conducting state, analyzing the instantaneous active or inactive state of said node $P_i$ as to its voltage, comparing with the aid of the test program, the states of the nodes $P_c$ and $P_i$, and using the receptor in a detection operation only if the state of the node $P_i$ is compatible with the activation state of the node $P_c$.

* * * * *